United States Patent [19]
Prall et al.

[11] Patent Number: 5,345,104
[45] Date of Patent: Sep. 6, 1994

[54] FLASH MEMORY CELL HAVING ANTIMONY DRAIN FOR REDUCED DRAIN VOLTAGE DURING PROGRAMMING

[75] Inventors: Kirk D. Prall; Wayne I. Kinney, both of Boise, Id.

[73] Assignee: Micron Technology, Inc., Boise, Id.

[21] Appl. No.: 89,382

[22] Filed: Jul. 8, 1993

Related U.S. Application Data

[63] Continuation of Ser. No. 883,495, May 15, 1992, abandoned.

[51] Int. Cl.$^5$ .................. H01L 29/167; H01L 29/68
[52] U.S. Cl. ..................... 257/607; 257/316; 257/408
[58] Field of Search .............. 357/23.5, 63; 257/316, 257/607, 408, 900

[56] References Cited

U.S. PATENT DOCUMENTS 4,698,787 10/1987 Mukherjee et al. ............... 257/316
4,875,085 10/1989 Ueno et al. ........................ 357/63

OTHER PUBLICATIONS

Richard D. Pashley & Stefan K. Lai, "Flash Memories: The Best of Two Worlds", Dec., 1989 (Entire Document).

*Primary Examiner*—Mark V. Prenty
*Attorney, Agent, or Firm*—Angus C. Fox, III

[57] ABSTRACT

An improved ETOX-type flash memory cell which requires only a single 5-volt power supply for read, write and erase functions. By substituting antimony or the combination of antimony and arsenic for the usual arsenic drain dopant, drain junction depth is reduced, due to the low diffusivity of antimony during high-temperature cycling. In order to maximize the concentration of antimony in the drain region, which is limited to approximately $3 \times 10^{19}$ atoms/cm$^3$ (due to solid solubility characteristics of antimony at standard silicon process activation temperatures in the 800°–1,000° C. range), an antimony implant concentration of approximately $1 \times 10^{15}$ atoms/cm$^2$ is employed. The resulting shallow junction raises the electric field strength at the cell's drain junction, thus increasing the hot electron generation rate and improving the programming efficiency. The decreased junction depth also acts to improve short channel effects such as punch-through and drain-to-gate capacitive coupling. The addition of a boron halo implant to obtain a traditional doubly diffused drain further enhances programming efficiency.

8 Claims, 1 Drawing Sheet

FLASH MEMORY CELL HAVING ANTIMONY DRAIN FOR REDUCED DRAIN VOLTAGE DURING PROGRAMMING

This application is a continuation of application Ser. No. 07/883,495, which was filed on May 15, 1992, and is now abandoned.

FIELD OF THE INVENTION

This invention relates to integrated circuit design and, more specifically, to the design of flash memory cells which utilize hot-electron injection for write operations and Fowler-Nordheim tunneling for erase operations.

BACKGROUND OF THE INVENTION

Flash memories are based on the technology of either erasable programmable read only memories (EPROMs) or electrically erasable programmable read only memories (EEPROMs). Like EPROMs and EEPROMs, flash memories feature non-volatile data storage and fast read access.

EPROMs are characterized by arrays of single transistor cells. Although individual EPROM cells may be addressed during read and write operations, all cells in an array must be erased simultaneously through exposure to intense UV light. Typically, EPROMs must be removed from a computer system during reprogramming.

EEPROMs, on the other hand, are characterized by two transistor cells. The additional cell, provides individualized access during read, write and erase cycles. This additional flexibility, however, is offset by increased manufacturing costs and reduced device density.

In price and functionality, flash memories fall somewhere between EPROMs and EEPROMs. The density of flash memory rivals that of EPROMs. On the other hand, like EEPROMs, they can be reprogrammed without removal from their resident system.

Those flash devices that are based on EPROM technology are the least expensive and are the most likely candidates for aggressive downsizing and rapid price reductions. However, such devices require a 12-volt power supply for erase and write operations, as well as a 5-volt supply for normal read operations. This kind of device also requires a multi-step algorithm that verifies erasure. Its manufacturers insist that the 12-volt supply helps protect the circuit against accidental erasure. In addition, they note that a 12-volt supply is readily available in some systems such as desktop computers and laser printers. Intel Corporation, the most prominent manufacturer of these devices, and the company most responsible for achieving manufacturability of the device has bestowed upon this type of cell the trademarked name ETOX (for EPROM Tunnel OXide).

Those flash devices, on the other hand, that are based on EEPROM technology, are slightly more expensive. Nevertheless, they provide more flexible reprogramming and require only a 5-volt power supply for read, write and erase functions. The manufacturers of such devices (Texas Instruments, Inc. among them) counter the alleged twin power supply advantage relating to erasure protection with the argument that there are software techniques that may be employed to render accidental erasures too rare to be worth consideration.

The following technical references are incorporated herein as though set forth in full:

Silicon Processing for the VLSI Era, Volume 1—Process Technology, Stanley Wolf and Richard N. Tauber, Lattice Press, 1986;

Silicon Processing for the VLSI Era, Volume 2—Process Technology, Stanley Wolf, Lattice Press, 1990; and Flash memories: the best of two worlds, IEEE Spectrum, December 1989.

SUMMARY OF THE INVENTION

Reduction of the programming drain voltage is one of the key goals for the development of ETOX-type flash memory cells. This invention provides an improved ETOX-type flash memory cell which requires only a single 5-volt power supply for read, write and erase functions. It may be reasonably assumed that the cost of using ETOX-type flash memories will be reduced, and that their use-particularly in applications where power dissipation is critical—will increase.

In order to achieve a programming drain voltage of 5.0±0.5 volts, the electric field near the drain must be increased. The substitution of antimony or the combination of antimony and arsenic for the usual arsenic drain dopant, drain junction depth can be reduced, due to the low diffusivity of antimony during high-temperature cycling. In order to maximize the concentration of antimony in the drain region, which is limited to approximately $3 \times 10^{19}$ atoms/cm$^3$ (due to solid solubility characteristics of antimony at standard silicon process activation temperatures in the 800°–1,000° C. range), an antimony implant concentration of approximately $1 \times 10^{15}$ atoms/cm$^2$ is employed. The resulting shallow junction raises the electric field strength at the cell's drain junction, thus increasing the hot electron generation rate and improving the programming efficiency. The decreased junction depth also acts to improve short channel effects such as punch-through and drain-to-gate capacitive coupling. The addition of a boron halo implant to obtain a traditional doubly diffused drain further enhances programming efficiency. In the preferred embodiment of the invention, antimony is implanted aligned to the gate edge on the drain side of the cell IGFET, following which insulative spacers are created on the gate sidewalls. Arsenic is then implanted aligned to the gate sidewall spacer. Such a cell design provides the advantage of an antimony implanted drain coupled with low sheet resistance that is characteristic of arsenic-implanted silicon.

PREFERRED EMBODIMENT OF THE INVENTION

The improved flash memory cell may be manufactured using many different combinations of oxidation, deposition, masking, etching and implantation steps. The following process sequence is considered to be a process which minimizes process (particularly, masking) steps, and is included simply to demonstrate the manufacturability of the claimed integrated circuit structure.

Figure 1:
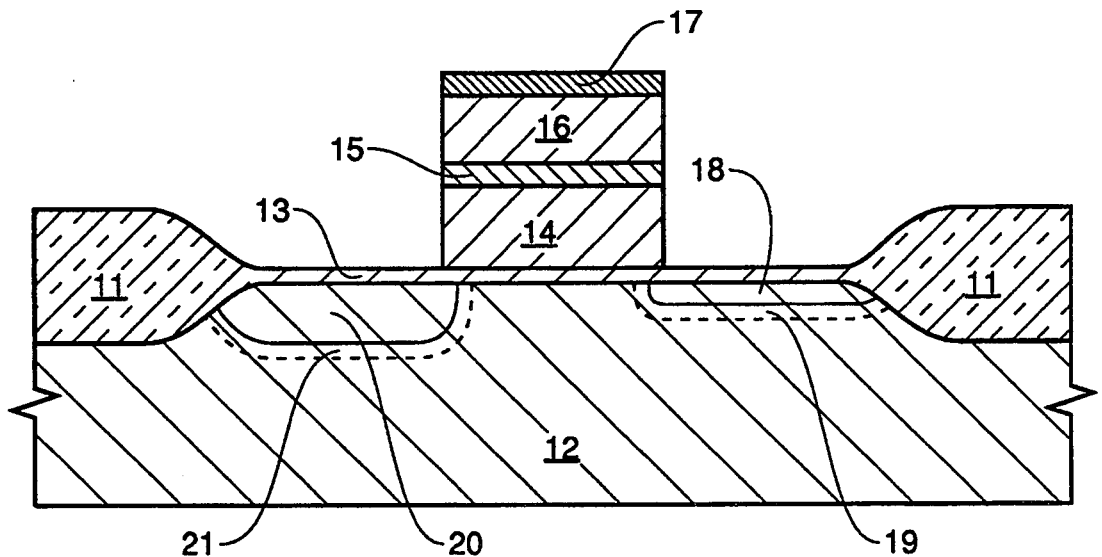
FIG. 1 is a cross-sectional view of the improved flash memory cell at a stage during the manufacturing process following the conventional steps of creating field isolation regions on a substrate, growing a gate oxide layer in active areas, depositing a first polycrystalline silicon (poly-1) layer, masking and etching the poly-1 layer in a direction more or less perpendicular to the routing direction of future control gate lines, creating an oxide-nitride-oxide layer on top of the poly-1 layer, depositing a second polycrystalline silicon (poly-2) layer, siliciding the upper surface of the poly-2 layer, masking and etching the silicided poly-2 and the novel steps of unmasked implanting of boron and antimony, masking the future drain region of each cell, implanting phosphorus and then arsenic in the future source region of each cell, and performing a high-temperature drive step.

Referring now to FIG. 1, a cell within the improved flash memory in cross-sectional format at a stage during the manufacturing process following the conventional steps of creating field isolation regions 11 on a substrate 12, growing a gate oxide layer 13 in active areas (those regions between isolation regions 11), depositing a first polycrystalline silicon (poly-1) layer 14, masking and etching the poly-1 layer 14 in a direction more or less perpendicular to the routing direction of future control gate lines (which will run more or less perpendicular to the surface of the page), creating an oxide-nitride-oxide (O-N-O) layer 15 on top of the poly-1 layer 14, depositing a second polycrystalline silicon (poly-2) layer 16, creating a tungsten silicide layer 17 on the upper surface of the poly-2 layer 16 in order to decrease sheet resistance of poly-2 layer 16, masking and etching the silicided poly-2 layer 16, the O-N-O layer 15, and the poly-1 layer 14 to stop on the gate oxide layer 13, and the novel steps of unmasked implanting of boron and antimony, masking the future drain region of each cell, implanting phosphorus and then arsenic in the future source region of each cell, and performing a high-temperature drive step. The antimony implant is performed at a dosage level of approximately $1 \times 10^{13}$ to $1 \times 10^{16}$ atoms/cm$^2$ with an implant energy of approximately 20 to 100 Kev, while the boron implant is performed at a dosage level of approximately $1 \times 10^{12}$ to $1 \times 10^{14}$ atoms/cm$^2$ with an implant energy of approximately 20 to 100 Kev. The masked phosphorus and arsenic implants are performed at dosage levels of approximately $1 \times 10^{12}$ to $1 \times 10^{4}$ atoms/cm$^2$ and $1 \times 10^{5}$ to $1 \times 10^{6}$ atoms/cm$^2$ respectively, and at energy levels of 20–100 Kev and 20–100 Kev, respectively. In the source regions of the cell, the unmasked boron implant is overwhelmed by the phosphorus implant, and the antimony implant is overwhelmed by the arsenic implant. Following the high-temperature drive step, performed at approximately 800°–1000° C. for a period of 1–2 hours, an antimony-implanted drain region 18 having a depth of approximately 1000 Å has been created. Because of the relatively higher diffusion rate of boron, as compared with antimony, during the high-temperature drive step, the boron implant has diffused beyond the limits of the diffused antimony implant, creating a boron "halo" which at least partially surrounds the diffused antimony implant. By definition, the channel of a field effect transistor is in the region between the source and drain regions. It will be noted that drain-side boron-doped region, or boron halo, 19 extends beyond the antimony-doped drain region 18 into the channel region, while the source-side phosphorus-doped region 21 extends beyond the arsenic-doped source region 20, creating a source-side graded junction, thus reducing the electric field and increasing the junction-to-substrate breakdown voltage on the source side of the channel, which, in turn, facilitates Fowler-Nordheim tunneling erasures of floating gate 14. An antimony and arsenic-implanted source region 20, having a depth of roughly 3000–5000 Å, has also been created, this being surrounded b a lightly-doped phosphorus region 21.

Figure 2:
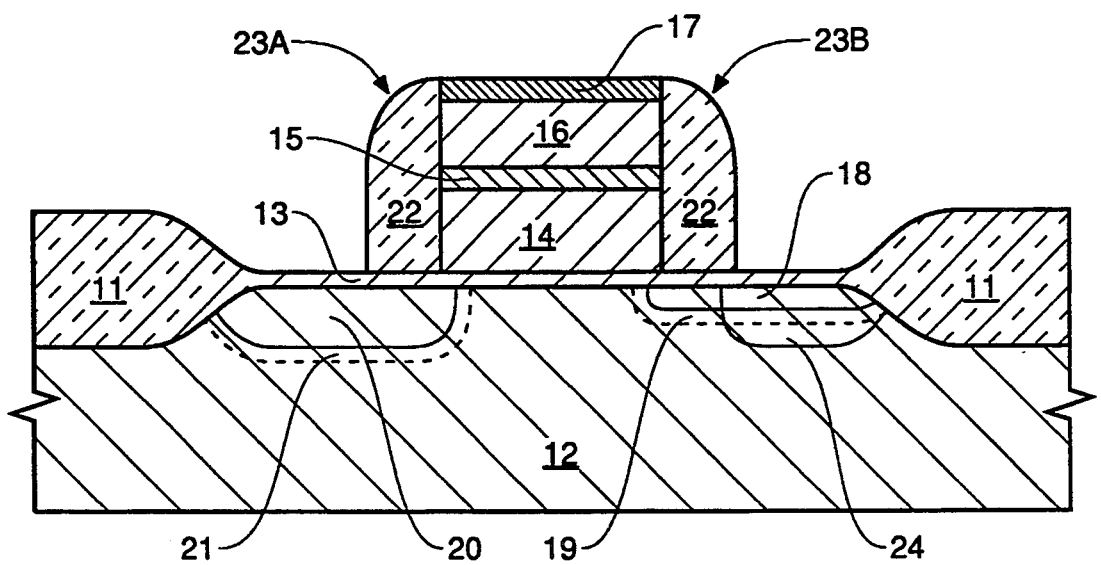
FIG. 2 is a cross-sectional view of the flash memory cell of FIG. 1, following the deposition of a spacer oxide layer, the anisotropic etch of the spacer oxide layer which creates spacers on the sidewalls of the floating and control gate layers, and unmasked implanting of arsenic.

Referring now to FIG. 2, the improved flash memory cell is depicted following further processing. Following the deposition of a substantially conformal silicon dioxide spacer layer 22, an anisotropic plasma etch is performed, which etches away most of spacer layer 22, but leaves oxide spacers 23A and 23B on the sidewalls of both poly-1 floating gate layer 14 and poly-2 control gate layer 16. An unmasked implanting with arsenic follows, which reduces the sheet resistance of the antimony-implanted drain regions 18 by creating an arsenic-doped region 24 that is offset from the floating gate edge nearest the cell drain by spacer 23B. The offset prevents the arsenic-doped regions 24 from being contiguous with the channel region, thus assuring that programming voltage will be dependent on the depth of only the antimony-doped drain region 18.

Although only a single embodiment of the improved flash memory cell is disclosed herein, it will be obvious to those having ordinary skill in the art of integrated circuit manufacture that modifications and changes may be made thereto without departing from the spirit and the scope of the invention as claimed.

We claim:

1. An improved flash memory cell of the type having a single field effect transistor, the channel of which is controlled by a floating gate insulated from the channel by a silicon dioxide gate dielectric layer, charge on the floating gate begin controlled by a control gate which is superjacent thereto by effecting hot electron injection into the floating gate through the gate dielectric layer from the drain region of said transistor during a write operation, and electron tunneling from the floating gate through the gate dielectric layer to the source of said transistor during an erase operation, said improvement comprising the use of only antimony as an N-type dopant in a portion of the drain region which is contiguous with the channel region, the antimony-doped portion of the drain region being partially surrounded by a boron doped region, which extends at least partially into the channel region, and the use of at least one N-type dopant having a higher diffusivity than antimony in the entire source region.

2. The improved flash memory cell of claim 1, wherein said drain region is doped to an antimony concentration of approximately $3 \times 10^{19}$ atoms/cm$^3$.

3. The improved flash memory cell of claim 1, wherein said drain region has a depth of approximately 1000 Å.

4. The improved flash memory cell of claim 3, which further comprises an arsenic-doped source region.

5. The improved flash memory cell of claim 4, wherein said arsenic-doped source region is surrounded by a source region lightly doped with phosphorus.

6. The improved flash memory cell of claim 3, wherein a portion of said antimony-doped drain region is further doped with arsenic to lower sheet resistance, said portion doped with arsenic being non-contiguous with the channel.

7. An improved flash memory cell of the type having a single FET with source, drain, and channel regions, and a control gate superjacent and insulated from a floating gate, said cell having a hot-electron injection programming mechanism and a Fowler-Nordheim tunneling erase mechanism, wherein the improvement comprises the use of only antimony as an N-type dopant in a portion of the drain region which is contiguous with the channel region, the antimony-doped portion of the drain region being partially surrounded by a boron doped region which extends into at least a portion of the channel region, and the use of at least one N-type dopant having a higher diffusivity than antimony in the entire source region.

8. The flash memory cell of claim 7, which further comprises an arsenic-doped drain region which overlaps a portion of the antimony-doped drain region, but which is not contiguous with the channel region.

* * * * *